(12) United States Patent
Kodani et al.

(10) Patent No.: US 11,424,402 B2
(45) Date of Patent: Aug. 23, 2022

(54) BIMORPH-TYPE PIEZOELECTRIC FILM

(71) Applicant: DAIKIN INDUSTRIES, LTD., Osaka (JP)

(72) Inventors: Tetsuhiro Kodani, Osaka (JP); Saori Sakami, Osaka (JP); Hiroyuki Sagami, Osaka (JP); Takaya Yamada, Osaka (JP); Shinya Bitou, Osaka (JP); Eri Mukai, Osaka (JP); Takashi Kanemura, Osaka (JP)

(73) Assignee: DAIKIN INDUSTRIES, LTD., Osaka (JP)

( * ) Notice: Subject to any disclaimer, the term of this patent is extended or adjusted under 35 U.S.C. 154(b) by 1002 days.

(21) Appl. No.: 16/088,664

(22) PCT Filed: Mar. 28, 2017

(86) PCT No.: PCT/JP2017/012768
§ 371 (c)(1),
(2) Date: Sep. 26, 2018

(87) PCT Pub. No.: WO2017/170616
PCT Pub. Date: Oct. 5, 2017

(65) Prior Publication Data
US 2020/0303619 A1 Sep. 24, 2020

(30) Foreign Application Priority Data

Mar. 28, 2016 (JP) .............................. JP2016-064772

(51) Int. Cl.
*H01L 41/08* (2006.01)
*B32B 27/30* (2006.01)
(Continued)

(52) U.S. Cl.
CPC .......... *H01L 41/0805* (2013.01); *B32B 27/30* (2013.01); *G06F 3/0414* (2013.01); *H01L 41/1132* (2013.01)

(58) Field of Classification Search
CPC ............... H01L 41/1132; H01L 41/193; H01L 41/0805; H01L 41/0926; G06F 3/0414; B32B 27/30
See application file for complete search history.

(56) References Cited

U.S. PATENT DOCUMENTS

2007/0283769 A1* 12/2007 Glaser .................... G01L 9/085
73/862.623
2011/0109204 A1 5/2011 Tajitsu et al.
(Continued)

FOREIGN PATENT DOCUMENTS

JP     2006-38710    2/2006
JP     2006-163619   6/2006
(Continued)

OTHER PUBLICATIONS

International Search Report dated Jun. 20, 2017 in International (PCT) Application No. PCT/JP2017/012768.
(Continued)

*Primary Examiner* — Vinh T Lam
(74) *Attorney, Agent, or Firm* — Wenderoth, Lind & Ponack, L.L.P.

(57) ABSTRACT

The present invention addresses the problem of providing a bimorph-type piezoelectric film that is less susceptible to the influence of pyroelectric noise resulting from temperature changes, and that makes it possible to provide a pressure-sensitive sensor or the like. The present invention provides a bimorph-type piezoelectric film comprising a first pyroelectric film having piezoelectric anisotropy in an in-plane direction, and a second pyroelectric film having piezoelectric anisotropy in an in-plane direction, the first pyroelectric (Continued)

film and the second pyroelectric film being disposed in such a manner that their surfaces on which electric charges of the same polarity are generated by a temperature increase are each outward-facing.

10 Claims, 1 Drawing Sheet

(51) Int. Cl.
*G06F 3/041* (2006.01)
*H01L 41/113* (2006.01)

(56) References Cited

U.S. PATENT DOCUMENTS

| | | |
|---|---|---|
| 2011/0128245 A1 | 6/2011 | Andoh et al. |
| 2016/0268931 A1* | 9/2016 | Aliane ................. H01L 41/193 |
| 2017/0033276 A1 | 2/2017 | Kou et al. |
| 2017/0155030 A1* | 6/2017 | Matsuda ............... B06B 1/0622 |
| 2017/0160147 A1 | 6/2017 | Genmei et al. |

FOREIGN PATENT DOCUMENTS

| | | | |
|---|---|---|---|
| JP | 6414596 B2 * | 10/2018 | ............... G01B 7/16 |
| WO | 2009/139237 | 11/2009 | |
| WO | 2009/144964 | 12/2009 | |
| WO | 2015/129829 | 9/2015 | |
| WO | WO-2015129829 A1 * | 9/2015 | ............. G06F 3/041 |
| WO | 2016/027495 | 2/2016 | |
| WO | WO-2016027495 A1 * | 2/2016 | ............... G01B 7/16 |

OTHER PUBLICATIONS

Extended European Search Report dated Oct. 25, 2019 in corresponding European Patent Application No. 17775153.4.

* cited by examiner

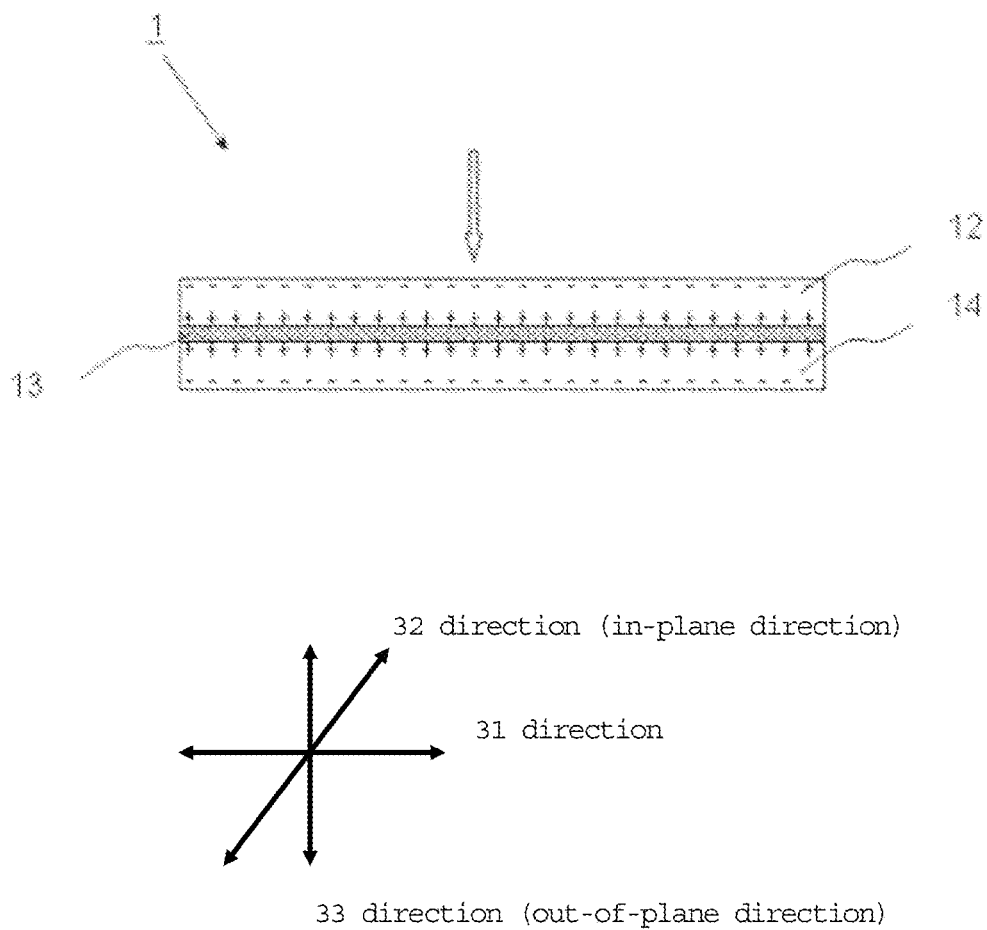

BIMORPH-TYPE PIEZOELECTRIC FILM

TECHNICAL FIELD

The present invention relates to a bimorph-type piezoelectric film.

BACKGROUND ART

Touch panels comprising a piezoelectric material have been heretofore proposed. When the piezoelectric material is pressed, the piezoelectric material generates a voltage in response to changes in strain with time during pressing. Patent Literature (PTL) 1 discloses a technique that takes advantage of this property, and enables the detection of not only touch positions but also pressing force (i.e., pressing intensity) applied to a touch panel comprising a piezoelectric material. Further, the use of a pyroelectric material as a piezoelectric material can enhance the sensitivity for detection of pressing force because of its relatively high piezoelectric constant.

However, in touch panels comprising a pyroelectric material, a temperature change of the pyroelectric material produces a voltage due to pyroelectric effect, which leads to noise output (pyroelectric noise). Thus, changes in environmental temperature may cause malfunction of the touch panel. Therefore, touch panels with suppressed pyroelectric noise are desired.

As touch panels with suppressed pyroelectric noise, Patent Literature (PTL) 2 discloses a bimorph-type piezoelectric film comprising
a first piezoelectric film,
a tackifier layer or an adhesive agent layer, and
a second piezoelectric film
in this order,
the first piezoelectric film and the second piezoelectric film being disposed in such a manner that their surfaces on which electric charges of the same polarity are generated by an increase in temperature are each outward-facing, and the first piezoelectric film and the second piezoelectric film each having a total light transmittance of 90% or more, and a total haze value of 8.0% or less.

CITATION LIST

Patent Literature

PTL 1: JP2006-163619A
PTL 2: WO2009/139237

SUMMARY OF INVENTION

Technical Problem

However, there is still a demand for providing a pyroelectric film that makes it possible to provide a touch panel with a higher piezoelectricity/pyroelectricity ratio (in this specification, this may be referred to as an S/N ratio).

The present invention was made to solve the above problem. An object of the present invention is to provide a bimorph-type piezoelectric film that is less susceptible to influence of pyroelectric noise resulting from temperature changes, and that makes it possible to provide a device comprising a pressure-sensitive sensor, such as a touch panel having a high piezoelectricity/pyroelectricity ratio.

Solution to Problem

The present inventors conducted extensive research. As a result, the inventors found that the above object can be solved by a bimorph-type piezoelectric film comprising a first pyroelectric film having piezoelectric anisotropy in an in-plane direction, and a second pyroelectric film having piezoelectric anisotropy in an in-plane direction, the first pyroelectric film and the second pyroelectric film being disposed in such a manner that their surfaces on which electric charges of the same polarity are generated by a temperature increase are each outward-facing. Thus, the inventors have accomplished the present invention.

The present invention includes the following embodiments.

Item 1.

A bimorph-type piezoelectric film comprising
a first pyroelectric film having piezoelectric anisotropy in an in-plane direction, and
a second pyroelectric film having piezoelectric anisotropy in an in-plane direction, the first pyroelectric film and the second pyroelectric film being disposed in such a manner that their surfaces on which electric charges of the same polarity are generated by a temperature increase are each outward-facing.

Item 2.

The bimorph-type piezoelectric film according to Item 1, wherein the 31 direction of the first pyroelectric film and the 31 direction of the second pyroelectric film have deviation in a rotational direction, the 31 direction being defined as a direction in which drawing the pyroelectric film generates the maximum charge per unit area when the film is drawn in various directions by a constant force not higher than the yield stress, or in such a manner that the strain generated by a force not higher than the yield stress is constant.

Item 3.

The bimorph-type piezoelectric film according to Item 1 or 2, wherein the aspect ratio of the first pyroelectric film and the aspect ratio of the second pyroelectric film are almost the same, and each exceeds 1.

Item 4.

The bimorph-type piezoelectric film according to any one of Items 1 to 3, wherein the first pyroelectric film and the second pyroelectric film are each a pyroelectric film of a vinylidene fluoride-based polymer.

Item 5.

The bimorph-type piezoelectric film according to any one of Items 1 to 3, wherein the first pyroelectric film and the second pyroelectric film are each a pyroelectric film of polyvinylidene fluoride.

Item 6.

The bimorph-type piezoelectric film according to any one of Items 1 to 3, wherein the first pyroelectric film and the second pyroelectric film are each a pyroelectric film of a vinylidene fluoride-tetrafluoroethylene copolymer.

Item 7.

The bimorph-type piezoelectric film according to any one of Items 1 to 3, wherein the first pyroelectric film and the second pyroelectric film are each a pyroelectric film of a vinylidene fluoride-trifluoroethylene copolymer.

Item 8.

The bimorph-type piezoelectric film according to any one of Items 1 to 7, which has a total light transmittance of 80% or more and a total haze value of less than 15.0%.

Item 9.

A pressure-sensitive sensor comprising the bimorph-type piezoelectric film according to any one of Items 1 to 8.

Item 10.

A touch panel comprising the pressure-sensitive sensor according to Item 9.

Advantageous Effects of Invention

The bimorph-type piezoelectric film of the present invention is less susceptible to the influence of pyroelectric noise resulting from temperature changes, and makes it possible to provide a device comprising a pressure-sensitive sensor, such as a touch panel having a high piezoelectric signal/pyroelectric noise ratio (S/N ratio).

BRIEF DESCRIPTION OF DRAWINGS

FIG. 1 is a schematic cross-sectional view of one embodiment of the bimorph-type piezoelectric film according to the present invention.

DESCRIPTION OF EMBODIMENTS

Meaning of Terms

In this specification, "detection" of a "touch position" means determination of a touch position; and "detection" of "touch pressure" means determination of the presence or absence of pressing force, speed or intensity (strength) of pressing force, changes in these, or combinations of these.

In this specification, the term "touch" encompasses touching, being touched, pressing, being pressed, and contacting.

In this specification, the term "polarized" means that the surface is electrically charged.

In this specification, the term "pyroelectric" refers to a property such that dielectric polarization (and electromotive force developed thereby) occurs in response to minute changes in temperature. The pyroelectric film has piezoelectricity.

In this specification, the term "aspect ratio" means the ratio between the length in the x-axis direction and the length in the y-direction of a planar shape (e.g., a rectangle, a circle) in two dimensions. For example, the aspect ratio of a rectangle is the ratio of the longer side to the shorter side of the rectangle. For example, the aspect ratio of a circle (an oval) is the ratio of the major axis to the minor axis of the circle.

Bimorph-Type Piezoelectric Film

The bimorph-type piezoelectric film of the present invention comprises
a first pyroelectric film having piezoelectric anisotropy in an in-plane direction, and
a second pyroelectric film having piezoelectric anisotropy in an in-plane direction,
the first pyroelectric film and the second pyroelectric film being disposed in such a manner that their surfaces on which electric charges of the same polarity are generated by a temperature increase are each outward-facing.

The bimorph-type piezoelectric film of the present invention is a laminate.

The first pyroelectric film and the second pyroelectric film of the bimorph-type piezoelectric film of the present invention are each a pyroelectric film.

The first pyroelectric film and the second pyroelectric film may be each a single layer, or a laminate. When the pyroelectric film is a laminate comprising two or more films, the films are disposed in such a manner that their surfaces on which electric charges of the same polarity are generated by a temperature increase are present on the same side (more specifically, for example, on the upper side of the piezoelectric film having a laminated structure (i.e., on the first principal surface). As explained below in the first pyroelectric film and the second pyroelectric film, the two or more layers of the pyroelectric film having a laminated structure may be bonded together with a tackifier layer or an adhesive agent layer; or may be directly contacted with each other, or thermally fused to each other.

In one embodiment of the present invention, the first pyroelectric film and the second pyroelectric film are bonded together with a tackifier layer or an adhesive agent layer. The bimorph-type pyroelectric film according to this embodiment of the present invention comprises
a first pyroelectric film having piezoelectric anisotropy in an in-plane direction,
a tackifier layer or an adhesive agent layer, and
a second pyroelectric film having piezoelectric anisotropy in an in-plane direction in this order,
the first pyroelectric film and the second pyroelectric film being disposed in such a manner that their surfaces on which electric charges of the same polarity are generated by a temperature increase are each outward-facing.

In another embodiment of the present invention, the first pyroelectric film and the second pyroelectric film are directly contacted with each other.

In one example of this embodiment, the first pyroelectric film and the second pyroelectric film can be held by being sandwiched with two base plates or the like.

In another example of this embodiment, the first pyroelectric film and the second pyroelectric film can be thermally fused to each other.

In another example of this embodiment, the first pyroelectric film and the second pyroelectric film can be bonded to each other by thermal compression.

Since the first pyroelectric film and the second pyroelectric film are disposed in such a manner that their surfaces on which electric charges of the same polarity are generated by a temperature increase are each outward-facing, the pyroelectric signal (pyroelectric noise) generated from each pyroelectric film is partially or entirely offset.

The first pyroelectric film and the second pyroelectric film used in the bimorph-type piezoelectric film of the present invention are each preferably an organic pyroelectric film, and is more preferably an organic ferroelectric film.

As is usually understood by a person skilled in the art, the "organic film," such as organic piezoelectric film, organic pyroelectric film, or organic ferroelectric film, is a film formed of an organic polymer (a polymer film).

As is usually understood by a person skilled in the art, the "organic piezoelectric film" is an organic film having piezoelectricity. The "organic pyroelectric film" is an organic film having pyroelectricity (and piezoelectricity). The "organic ferroelectric film" is an organic film having ferroelectricity (and pyroelectricity and piezoelectricity).

The organic film of the "organic pyroelectric film" used in the present invention is explained below.

The organic film of the first pyroelectric film and the organic film of the second pyroelectric film may be of the same type, or different types. Using the same type of organic film is preferable.

Examples of preferable "organic films" include vinylidene fluoride-based polymer films, odd-chain nylon films, and vinylidene cyanide-vinyl acetate copolymers.

The organic film used in the present invention is preferably a vinylidene fluoride-based polymer film.

As is usually understood by a person skilled in the art, the "vinylidene fluoride-based polymer film" is a film formed of a vinylidene fluoride-based polymer, and comprises a vinylidene fluoride-based polymer.

In this specification, preferable examples of the "vinylidene fluoride-based polymer film" include polyvinylidene fluoride films, vinylidene fluoride-tetrafluoroethylene copolymer films, and vinylidene fluoride-trifluoroethylene copolymer films.

The terms "polyvinylidene fluoride films," "vinylidene fluoride-tetrafluoroethylene copolymer films," and "vinylidene fluoride-trifluoroethylene copolymer films" used in this specification are intended to include films comprising such a polymer as a base material.

The polymer content of the organic film used in the present invention is preferably 50 mass % or more, more preferably 70 mass % or more, even more preferably 80 mass % or more, still even more preferably 85 mass % or more, particularly 90 mass % or more, and more particularly preferably 95 mass % or more. The upper limit of the content is not particularly limited. For example, the upper limit may be 100 mass % or 99 mass %.

The "organic film" may optionally contain one or more components other than the polymer, as long as the effect of the present invention is not significantly impaired. Examples of such other components include additives typically used in resin films.

Preferable examples of the polymer include vinylidene fluoride-based polymers.

Examples of the "vinylidene fluoride-based polymers" include:
(1) a copolymer of vinylidene fluoride and one or more monomers copolymerizable with vinylidene fluoride; and
(2) polyvinylidene fluoride.

Examples of the "monomers copolymerizable with vinylidene fluoride" in the "(1) copolymer of vinylidene fluoride and one or more monomers copolymerizable with vinylidene fluoride" include trifluoroethylene, tetrafluoroethylene, hexafluoropropylene, chlorotrifluoroethylene, and vinyl fluoride.

The "one or more monomers copolymerizable with vinylidene fluoride" or at least one of the monomers is preferably tetrafluoroethylene.

Preferred examples of the "vinylidene fluoride-based polymers" include a vinylidene fluoride-tetrafluoroethylene copolymer.

The "(1) copolymer of vinylidene fluoride and one or more monomers copolymerizable with vinylidene fluoride" preferably contains 5 mol % or more, 10 mol % or more, 15 mol % or more, 20 mol % or more, 25 mol % or more, 30 mol % or more, 35 mol % or more, 40 mol % or more, 45 mol % or more, 50 mol % or more, or 60 mol % or more, of repeating units derived from vinylidene fluoride.

The molar ratio of the repeating units derived from tetrafluoroethylene to the repeating units derived from vinylidene fluoride in the "vinylidene fluoride-tetrafluoroethylene copolymer" is preferably within the range of 5/95 to 90/10, more preferably 5/95 to 75/25, even more preferably 15/85 to 75/25, and still even more preferably 36/64 to 75/25.

The copolymer with a high content of vinylidene fluoride is preferable in terms of excellent solvent solubility and excellent processability of the film.

The molar ratio of the repeating units derived from tetrafluoroethylene to the repeating units derived from vinylidene fluoride in the "vinylidene fluoride/tetrafluoroethylene copolymer" is preferably within the range of 5/95 to 37/63, more preferably 10/90 to 30/70, and still more preferably 5/85 to 25/75.

The copolymer with a higher tetrafluoroethylene content is preferable in terms of excellent heat resistance of the film.

The molar ratio of the repeating units derived from tetrafluoroethylene to the repeating units derived from vinylidene fluoride in the "vinylidene fluoride-tetrafluoroethylene copolymer" is preferably within the range of 60/40 to 10/90, more preferably 50/50 to 25/75, and even more preferably 45/55 to 30/70.

The "vinylidene fluoride-tetrafluoroethylene copolymer" may contain repeating units derived from a monomer other than vinylidene fluoride and tetrafluoroethylene, insofar as the properties of the present invention are not significantly impaired. The content of such repeating units can be usually, for example, 20 mol % or less, 10 mol % or less, 5 mol % or less, or 1 mol % or less. Such monomers are not limited, as long as they can be copolymerized with a vinylidene fluoride monomer and/or a tetrafluoroethylene monomer. Examples include
(1) HFO-1234yf ($CF_3CF=CH_2$), 3,3,4,4,5,5,6,6,7,7,8,8,8-tridecafluorooct-1-ene ($C_6$ olefin), fluoromonomers (e.g., vinyl fluoride (VF), trifluoroethylene (TrFE), hexafluoropropene (HFP), 1-chloro-1-fluoro-ethylene (1,1-CFE), 1-chloro-2-fluoro-ethylene (1,2-CFE), 1-chloro-2,2-difluoroethylene (CDFE), chlorotrifluoroethylene (CTFE), trifluorovinyl monomers, 1,1,2-trifluorobutene-4-bromo-1-butene, 1,1,2-trifluorobutene-4-silane-1-butene, perfluoroalkyl vinyl ether, perfluoromethyl vinyl ether (PMVE), perfluoropropyl vinyl ether (PPVE), perfluoroacrylate, 2,2,2-trifluoroethyl acrylate, and 2-(perfluorohexyl)ethyl acrylate); and
(2) hydrocarbon-based monomers (e.g., ethylene, propylene, maleic anhydride, vinyl ether, vinyl ester, allyl glycidyl ether, acrylic acid-based monomers, methacrylic acid based monomers, and vinyl acetate).

As is easily understood by a person skilled in the art, the first pyroelectric film and the second pyroelectric film are stacked atop each other.

The 31 direction of the first pyroelectric film and the 31 direction of the second pyroelectric film preferably have a deviation in the rotational direction. In the bimorph-type piezoelectric film of the present invention, the 31 direction of the first pyroelectric film and the 31 direction of the second pyroelectric film are preferably not the same.

In this specification, the 31 direction of a pyroelectric film is defined as a direction in which drawing the pyroelectric film generates the maximum electric charge per unit area when the film is drawn in various directions with a constant force not higher than yield stress, or in such a manner that the strain generated by a force not higher than yield stress is constant.

The in-plane direction orthogonal to the 31 direction is defined as 32 direction.

The out-of-plane direction orthogonal to the 31 direction and the 32 direction (the film thickness direction) is defined as 33 direction.

The total of the piezoelectric signal generated by the first pyroelectric film and the second pyroelectric film in this configuration is large, as compared with the case in which the 31 direction of the first pyroelectric film and the 31 direction of the second pyroelectric film are the same.

As a result, due to the effect combined with the offset of pyroelectric signal described above, a significantly high ratio of piezoelectricity to pyroelectricity in the bimorph-type piezoelectric film of the present invention (herein sometimes referred to as the S/N ratio) is achieved.

The deviation in the rotational direction is preferably within the range of 20° to 160°, more preferably 40° to 140°, even more preferably 60° to 120°, still more preferably 80° to 100°, and particularly preferably about 90°.

As can be understood from the above explanation, in a preferable embodiment of the present invention, the first pyroelectric film and the second pyroelectric film are each a pyroelectric film of polyvinylidene fluoride.

As can be understood from the above explanation, in another preferable embodiment of the present invention, the first pyroelectric film and the second pyroelectric film are each a pyroelectric film of a vinylidene fluoride-tetrafluoroethylene copolymer.

As can be understood from the above explanation, in another preferable embodiment of the present invention, the first pyroelectric film and the second pyroelectric film are each a pyroelectric film of a vinylidene fluoride-trifluoroethylene copolymer.

The first pyroelectric film and the second pyroelectric film preferably have the same shape and the same size.

Preferably, the first pyroelectric film and the second pyroelectric film have almost the same aspect ratio, and each exceeds 1.

The aspect ratio is preferably 1.1 or more, more preferably 1.5 or more, even more preferably 1.8 or more, still even more preferably 2.0 or more, particularly preferably 3.0 or more, and more particularly preferably 4.0 or more.

The aspect ratio is preferably within the range of 1.5 to 30, more preferably 1.8 to 20, and even more preferably 2.0 to 10.

In the bimorph-type piezoelectric film of the present invention, particularly when each of the first pyroelectric film and second pyroelectric film whose 31 directions are not the same has an aspect ratio as described above, the piezoelectric signal is offset only slightly, thus obtaining a high S/N ratio.

Particularly when the bimorph-type piezoelectric film of the present invention is required to have a high transparency, for example, when the film is used for a transparent pressure-sensitive sensor or the like, the first pyroelectric film (and the second pyroelectric film described below) preferably have the optical properties described below.

The total light transmittance of the first pyroelectric film can be preferably 80% or more, 85% or more, 89% or more, 91% or more, or 93% or more. Although the upper limit of the total light transmittance is not limited, the total light transmittance of the first pyroelectric film is typically 99% or less.

In this specification, the "total light transmittance" is obtained by a light transmittance test according to ASTM D1003 using a "Haze Meter NDH7000SP CU2II" (product name, produced by Nippon Denshoku Industries Co., Ltd.), or an equivalent.

The total haze of the first pyroelectric film is preferably 15% or less, 10% or less, 6.0% or less, 4.0% or less, 3.0% or less, and 2.0% or less, or 1.5% or less. The lower the total haze, the more preferable. Although the lower limit is not limited, the total haze of the first pyroelectric film is typically 0.1% or more.

The "total haze" as used herein is obtained by a haze (turbidity) test according to ASTM D1003 using a "Haze Meter NDH7000SP CU2II" (product name, produced by Nippon Denshoku Industries Co., Ltd.), or an equivalent.

The internal haze of the first pyroelectric film is preferably, for example, 15% or less, 10% or less, 6.0% or less, 4.0% or less, 3.0% or less, 2.0% or less, 1.5% or less, 1.0% or less, 0.8% or less, 0.6% or less, or 0.4% or less. The lower the internal haze, the more preferable. Although the lower limit is not limited, the internal haze value of the first pyroelectric film is typically 0.1% or more.

The "internal haze value" (inner haze) as used herein is obtained by measuring the haze value according to the above method for determining the total haze, in which water is placed in a quartz cell, the film is inserted therein, and a haze value is measured.

The outer haze of the first pyroelectric film is preferably, for example, 15% or less, 10% or less, 3.0% or less, 1.5% or less, and 1.0% or less. The lower the outer haze, the more preferable. Although the lower limit is not limited, the outer haze of the pyroelectric film of the present invention is typically 0.1% or more.

The "outer haze" as used herein is calculated by subtracting the internal haze from the total haze of the film.

The constant e is defined as the amount of electric charge generated per unit area and unit strain.

The constant d is defined as constant e per storage elastic modulus.

The piezoelectric strain constant (d31) of the first pyroelectric film is preferably in the range of 150 to 1.5 pC/N, more preferably 100 to 2 pC/N, and even more preferably 50 to 5 pC/N.

The piezoelectric strain constant (d32) of the first pyroelectric film is preferably in the range of 149 to 0.5 pC/N, more preferably 98 to 1 pC/N, and even more preferably 48 to 1 pC/N.

In this specification, "having piezoelectric anisotropy in an in-plane direction" means that
(1) the value obtained by subtracting d32 from d31 (d31−d32) is 0.5 or more,
(2) the d31/d32 ratio is 1.3 or more,
(3) the value obtained by subtracting e32 from e31 (e31−e32) is 1.0 or more, or
(4) the e31/e32 ratio is 1.3 or more.

The difference between d31 and d32 (d31−d32) is preferably within the range of 1.0 to 100 pC/N, more preferably 1.0 to 60 pC/N, even more preferably 1.5 to 45 pC/N, still even more preferably 2.0 to 30 pC/N, and particularly preferably 3.0 to 30 pC/N.

The ratio of d31 to d32 (d31/d32) is preferably within the range of 50 to 1.5, more preferably 45 to 1.5, even more preferably 40 to 1.5, still even more preferably 30 to 1.5, particularly preferably 20 to 2, and more particularly preferably 15 to 2.

The piezoelectric strain constant (d33) of the first pyroelectric film is preferably within the range of 250 to 1.0 pC/N, more preferably 200 to 1.0 pC/N, even more preferably 150 to 1.0 pC/N, still even more preferably 100 to 1.0 pC/N, particularly preferably 60 to 2.0 pC/N, and more particularly preferably 40 to 2.0 pC/N.

The piezoelectric stress constant (e31) of the first pyroelectric film is preferably within the range of 200 to 1.5 $mC/m^2$, more preferably 150 to 1.5 $mC/m^2$, even more preferably 130 to 2.0, and still even more preferably 70 to 2.0 $mC/m^2$.

The piezoelectric stress constant (e32) of the first pyroelectric film is preferably within the range of 199 to 0.5 $mC/m^2$, more preferably 149 to 0.5 $mC/m^2$, even more preferably 129 to 1.0 $mC/m^2$, and particularly preferably 149 to 1.0 $mC/m^2$.

The difference between e31 and e32 (e31−e32) is preferably within the range of 150 to 1.1 $mC/m^2$, more preferably 130 to 1.5 $mC/m^2$, even more preferably 100 to 1.5 $mC/m^2$, and still even more preferably 60 to 2.0 $mC/m^2$.

The ratio of e31 to e32 (e31/e32) is preferably within the range of 50 to 1.5, more preferably 45 to 1.5, even more preferably 40 to 1.5, still even more preferably 30 to 1.5, particularly preferably 20 to 2, and more particularly preferably 15 to 2.

The piezoelectric stress constant (e33) of the first pyroelectric film is preferably within the range of 250 to 1.0 pC/N, more preferably 200 to 1.0 mC/m$^2$, even more preferably 150 to 1.0 mC/m$^2$, still even more preferably 100 to 1.0 mC/m$^2$, particularly preferably 60 to 2.0 mC/m$^2$, and more particularly preferably 40 to 2.0 mC/m$^2$.

Measurement and Determination of d31, d32, e31, and e32

In this specification, the methods for determining the piezoelectric strain constants (d31 and d32) and piezoelectric stress constants (e31 and e32) of each single-layer pyroelectric film are not particularly limited as long as sufficiently accurate values can be obtained. The measurement and determination can be performed by any appropriate method. Preferably, the measurement and determination are performed by using the following apparatus. The measurement method is explained below.

Measuring Apparatus

Dynamic viscoelasticity measuring device: DVA-220 (product name, produced by IT Measurement Co., Ltd.)

An aluminum electrode is vapor-deposited on each of the upper and lower surfaces of a single-layer pyroelectric film sample in such a manner that the electrodes have an overlapped portion in an area of 6×10$^{-5}$ m$^2$ in a planar view. Two leads made of aluminum foil and reinforced by applying an insulating adhesive tape are adhered individually to the upper and lower flat electrodes, using a conductive epoxy resin.

Using a dynamic viscoelasticity measuring device, both ends of the sample are tested at an amplitude of 0.3% and at 1 Hz. The piezoelectric signal that appears is measured with a logger via a charge amplifier, and the electric charge generated per unit area is calculated.

In one preferable embodiment of the present invention, a stretching film can be used as a film having piezoelectric anisotropy in an in-plane direction.

When a stretching film is used, the 31 direction of the stretched film is usually the stretching direction or the machine direction (MD). However, the present invention is not limited thereto.

In another preferable embodiment of the present invention, an extrusion-molded film can be used as a film having piezoelectric anisotropy in an in-plane direction.

In another preferable embodiment of the present invention, a film produced by stretching after extrusion can be used as a film having piezoelectric anisotropy in an in-plane direction.

When a bimorph is produced by using a stretching film as the first pyroelectric film and the second pyroelectric film (particularly when the aspect ratio of the film is not 1 and the two films do not completely overlap with each other when the directions of the films are changed), the two films are usually superposed on each other in such a manner that their stretching directions or machine directions (MD) are practically the same. However, as stated above, in the present invention, two films are preferably superposed on each other in such a manner that their stretching directions or machine directions (MD) are different from each other.

Measurement and Determination of d33

In the present specification, the methods for determining the piezoelectric strain constant (d33) and the piezoelectric stress constant (e33) of the single-layer pyroelectric film are not particularly limited, as long as sufficiently accurate values can be obtained. The measurement and determination can be performed by any appropriate method. Preferably, the measurement and determination can be performed by using the following device. The measurement method is explained below.

Measuring Apparatus d33 meter: Piezometer System PM300 (product name, produced by Piezotest Ltd.) (using pins with a tip of 1.5 mm φ as sample fixtures).

The piezoelectric strain constant d33 is measured at 10 points on the film selected in a non-arbitrary manner. The arithmetic average of the thus-obtained values is defined as the piezoelectric strain constant d33 of the film. In the present invention, selecting 10 points on the film in a non-arbitrary manner can be performed by selecting, for example, 10 points at intervals of 50 mm therebetween on a straight line. The term "arbitrary" herein means that the coefficient of variation described below is intended to be made smaller.

The actual measurement value of the piezoelectric strain constant d33 may be a positive value or a negative value depending on whether the film is measured on the front side or rear side. In this specification, the absolute value is described as the piezoelectric strain constant d33.

As the second pyroelectric film used in the bimorph-type piezoelectric film of the present invention, for example, the same film as that used as the first pyroelectric film may be used.

Preferable examples of the second pyroelectric film used in the bimorph-type piezoelectric film of the present invention may be the same as the preferable examples of the first pyroelectric film described above.

The second pyroelectric film used in the bimorph-type piezoelectric film of the present invention may be the same as, or different from, the first pyroelectric film.

The amount of charge pyroelectrically generated (per unit area) on the first pyroelectric film upon change in temperature from −20° C. to 60° C. is preferably within the range of 7500 to 5 μC/m$^2$, more preferably 5000 to 5 μC/m$^2$, even more preferably 3000 to 5 μC/m$^2$, and still even more preferably 3000 to 8 μC/m$^2$.

The amount of charge pyroelectrically generated (per unit area) on the second pyroelectric film upon change in temperature from −20° C. to 60° C. is preferably within the range of 7500 to 5 μC/m$^2$, more preferably 5000 to 5 μC/m$^2$, even more preferably 3000 to 5 μC/m$^2$, and still even more preferably 3000 to 8 μC/m$^2$.

The charge amounts can be determined in accordance with the method disclosed in the Examples.

The pyroelectric properties of the second pyroelectric film are preferably close to those of the first pyroelectric film.

Specifically, the ratio of charges pyroelectrically generated upon change in temperature from −20° C. to 60° C. (the ratio of the charge pyroelectrically generated on the second pyroelectric film to the charge pyroelectrically generated on the first pyroelectric film) is preferably in the range of 0.5 to 2.0, more preferably in the range of 0.8 to 1.2, and even more preferably in the range of 0.95 to 1.05.

From the viewpoint of obtaining a high S/N ratio, the piezoelectric properties of the second pyroelectric film are preferably different from those of the first pyroelectric film.

Specifically, for example, the ratio of d31 of the second pyroelectric film to d31 of the first pyroelectric film is preferably in the range of 1.4 to 50, and more preferably in the range of 1.4 to 20.

Specifically, for example, the ratio of d32 of the second pyroelectric film to d32 of the first pyroelectric film is preferably in the range of 1.4 to 50, and more preferably in the range of 1.4 to 20.

Specifically, for example, the ratio of d33 of the second pyroelectric film to d33 of the first pyroelectric film is preferably in the range of 1.4 to 20.

Specifically, for example, the ratio of e31 of the second pyroelectric film to e31 of the first pyroelectric film is preferably in the range of 1.4 to 50, and more preferably in the range of 1.4 to 20.

Specifically, for example, the ratio of e32 of the second pyroelectric film to e32 of the first pyroelectric film is preferably in the range of 1.4 to 50, and more preferably in the range of 1.4 to 20.

Specifically, for example, the ratio of e33 of the second pyroelectric film to e33 of the first pyroelectric film is preferably in the range of 1.4 to 2.0.

The charge amounts can be determined in accordance with the method disclosed in the Examples below.

From the viewpoint of ease of production, the piezoelectric properties of the second pyroelectric film are preferably close to those of the first pyroelectric film.

Specifically, for example, the ratio of d31 of the second pyroelectric film to d31 of the first pyroelectric film is preferably in the range of 0.6 to 1.4, and preferably in the range of 0.8 to 1.2.

Specifically, for example, the ratio of d32 of the second pyroelectric film to d32 of the first pyroelectric film is preferably in the range of 0.6 to 1.4, and more preferably in the range of 0.8 to 1.2.

Specifically, for example, the ratio of d33 of the second pyroelectric film to d33 of the first pyroelectric film is preferably in the range of 0.6 to 1.4, and more preferably in the range of 0.8 to 1.2.

Specifically, for example, the ratio of e31 of the second pyroelectric film to e31 of the first pyroelectric film is preferably in the range of 0.6 to 1.4, and more preferably in the range of 0.8 to 1.2.

Specifically, for example, the ratio of e32 of the second pyroelectric film to e32 of the first pyroelectric film is preferably in the range of 0.6 to 1.4, and more preferably in the range of 0.8 to 1.2.

Specifically, for example, the ratio of e33 of the second pyroelectric film to e33 of the first pyroelectric film is preferably in the range of 0.6 to 1.4, and more preferably in the range of 0.8 to 1.2.

Tackifier Layer or Adhesive Agent Layer

In the bimorph-type piezoelectric film of the present invention, the first and second pyroelectric films are bonded to each other through a tacky sheet or an adhesive agent layer.

The tacky sheet is not particularly limited, as long as the first and second pyroelectric films can be bonded to each other. The tacky sheet may be famed of a single layer, or two or more layers. More specifically, when the tacky sheet is formed of a single layer, the tacky sheet is formed of a tackifier layer. When the tacky sheet is formed of two or more layers, both outer layers are tackifier layers. When the tacky sheet is formed of three or more layers, the tacky sheet may comprise a substrate layer as an inner layer.

It is sufficient that the substrate layer for the tacky sheet is a transparent film. Preferable examples include films formed of polyimide, polyethylene terephthalate, polybutylene terephthalate, polycarbonate, poly(p-phenylene sulfide), or polyamide imide.

The tackifier layer of the tacky sheet may contain an acrylic-based tackifier as a tackifier.

The adhesive agent that forms the adhesive agent layer may be an acrylic-based adhesive.

The tackifier layer or adhesive agent layer used in the bimorph-type piezoelectric film of the present invention is preferably, for example, a tackifier layer formed of a polymer containing at least one type of acrylic-based monomer having an ester group (—COO—) as a constituent unit. Examples of the acrylic-based monomer having an ester group (—COO—) include alkyl(meth)acrylate represented by formula $CH_2=CR^1-COOR^2$ (wherein $R^1$ represents hydrogen or methyl, and $R^2$ represents alkyl having 1 to 14 carbon atoms); and (meth)acrylate, such as hydroxy-containing (meth)acrylate.

Specific examples of the alkyl(meth)acrylate represented by formula $CH_2=CR^1-COOR^2$ (wherein $R^1$ represents hydrogen or methyl, and $R^2$ represents alkyl having 1 to 14 carbon atoms) include methyl (meth)acrylate, ethyl (meth)acrylate, n-propyl (meth)acrylate, isopropyl (meth)acrylate, n-butyl (meth)acrylate, isobutyl (meth)acrylate, t-butyl (meth)acrylate, n-pentyl (meth)acrylate, isopentyl (meth)acrylate, n-hexyl (meth)acrylate, 2-ethylhexyl (meth)acrylate, n-octyl (meth)acrylate, isooctyl (meth)acrylate, isononyl (meth)acrylate, decyl (meth)acrylate, and dodecyl (meth)acrylate. These can be used singly, or in a combination of two or more. Of these, 2-ethylhexyl (meth)acrylate and n-butyl (meth)acrylate are preferably used.

From the standpoint of adhesive power, the number of carbon atoms of the alkyl group $R^2$ of alkyl(meth)acrylate is 1 to 14. Alkyl having 15 or more carbon atoms is not preferable because the adhesive power may be lowered. The alkyl group $R^2$ preferably has 1 to 12 carbon atoms, preferably 4 to 12 carbon atoms, and more preferably 4 to 8 carbon atoms.

Among alkyl(meth)acrylates wherein alkyl group $R^2$ has 1 to 14 carbon atoms, alkyl(meth)acrylates wherein alkyl represented by $R^2$ has 1 to 3 or 13 to 14 carbon atoms may be used as a part of the monomer. However, it is preferable to use, as an essential component, alkyl(meth)acrylate wherein the alkyl group represented by $R^2$ has 4 to 12 carbon atoms (e.g., 50 to 100 mol %).

The alkyl represented by $R^2$ may be a linear or branched-chain alkyl.

Another preferable example of the tackifier layer or adhesive agent layer used in the bimorph-type piezoelectric film of the present invention may be, for example, a tackifier layer or adhesive agent layer formed of a polymer containing at least one type of hydroxyl-containing (meth)acrylate as a constituent unit. Examples of the hydroxyl-containing (meth)acrylate include 2-hydroxyethyl (meth)acrylate, 2-hydroxypropyl (meth)acrylate, 4-hydroxybutyl (meth)acrylate, polyethylene glycol mono(meth)acrylate, polypropylene glycol mono(meth)acrylate, and cyclohexane dimethanol mono(meth)acrylate. A pressure-sensitive tacky layer containing neither carboxylic acid nor hydroxyl groups may also be used. Since carboxylic acid may cause whitening, a tackifier layer or adhesive agent layer containing no carboxylic acid is preferable.

From the standpoint of storage modulus enhancement, the tackifier layer or adhesive agent layer used in the bimorph-type piezoelectric film of the present invention is also preferably formed of, for example, the polymer described above into which crosslinkable sites are introduced. Examples of crosslinkable sites include thermal crosslinking, chemical crosslinking, and ultraviolet crosslinking, and like sites. Thermal crosslinking or ultraviolet crosslinking is preferable. For example, a structure capable of being excited by ultraviolet irradiation and removing a hydrogen radical from another portion in the (meth)acrylic copolymer molecule or from another (meth)acrylic copolymer molecule can be used as the ultraviolet-crosslinkable site. Examples of such a structure include a benzophenone structure, a benzyl structure, an o-benzoylbenzoic acid ester structure, a thioxanthone structure, a 3-ketocoumarin structure, a 2-ethylanthraquinone structure, a camphorquinone structure, and the like.

The tackifier layer or adhesive agent layer may contain additive(s) that can typically be contained in tackifier compositions or adhesive compositions that form the tackifier layer or adhesive agent layer, as long as the effect of the present invention is not greatly impaired.

The tacky sheet or adhesive agent layer used in the present invention has a storage modulus of preferably 0.08 MPa or more, more preferably 0.1 MPa or more, and even more preferably 0.12 MPa or more. The upper limit of the storage modulus of the tacky sheet or the adhesive agent layer used in the present invention is not particularly limited. The storage modulus of the tacky sheet or the adhesive agent layer used in the present invention is typically 3 GPa or less.

Particularly when the bimorph-type piezoelectric film of the present invention is required to have high transparency, for example, when the bimorph-type piezoelectric film of the present invention is used as a transparent pressure-sensitive sensor or the like, the tacky sheet or adhesive agent layer preferably have the optical properties described below.

The tacky sheet or adhesive agent layer used in the present invention has an inner haze of preferably 5% or less, more preferably 3% or less, even more preferably 1% or less, still even more preferably 0.6% or less, particularly preferably 0.5% or less, and more particularly preferably 0.4% or less. The lower limit of inner haze of the tacky sheet or the adhesive agent layer used in the present invention is not particularly limited. The inner haze of the tacky sheet or the adhesive agent layer used in the present invention is typically 0.01% or more.

The tacky sheet or adhesive agent layer used in the present invention has a thickness of preferably 250 μm or less, more preferably 100 μm or less, even more preferably 30 μm or less, and still even more preferably 15 μm or less. The tacky sheet or adhesive agent layer used in the present invention has a thickness of preferably 0.1 μm or more, and more preferably 1 μm or more.

In a preferable embodiment of the present invention, the tacky sheet or adhesive agent layer has a storage modulus of 0.1 MPa or more, and a thickness of 15 μm or less.

In particular, when the bimorph-type piezoelectric film of the present invention is required to have a high transparency, for example, when the bimorph-type piezoelectric film of the present invention is used for a transparent pressure-sensitive sensor or the like, the film preferably has the following optical properties.

In a preferable embodiment of the bimorph-type piezoelectric film of the present invention, the first and second pyroelectric films are each a pyroelectric film of a vinylidene fluoride-tetrafluoroethylene copolymer, and have a total transmittance of 92% or more, an inner haze value of 5% or less, and a thickness of 40 μm or less. The first and second pyroelectric films may be different in film thickness. In this case, a thinner pyroelectric film is preferably disposed on the outer side when the films are bent by touching or the like.

The upper limit of the thickness of each of the first and second pyroelectric films is preferably, for example, 2 mm, 1 mm, 500 μm, 100 μm, 80 μm, 60 μm, 50 μm, 40 μm, or 30 μm.

The lower limit of the thickness of each of the first and second pyroelectric films is preferably, for example, 40 μm, 30 μm, 20 μm, 10 μm, 3 μm, or 1 μm.

The thickness of each of the first and second pyroelectric films is preferably, for example, in the range of 10 to 100 μm, or 20 to 80 μm.

In a preferable embodiment of the present invention, the first and second pyroelectric films are each a pyroelectric film of a vinylidene fluoride-tetrafluoroethylene copolymer, and have a total transmittance of 80% or more, an inner haze value of 7% or less, and a thickness of 40 μm or less, while the tacky sheet or the adhesive agent layer has a storage modulus of 0.1 MPa or more and a thickness of 15 μm or less.

The total light transmittance of the bimorph-type piezoelectric film of the present invention is preferably, for example, 75% or more, 80% or more, 85% or more, 90% or more, 91% or more, or 92% or more. Although the upper limit of the total light transmittance is not limited, the total light transmittance of the first pyroelectric film is typically 99% or less.

The total haze of the bimorph-type piezoelectric film of the present invention is preferably, for example, 20% or less, 15% or less, 10.0% or less, 6.0% or less, or 4.0% or less. Although the upper limit of the total haze of the bimorph-type piezoelectric film of the present invention is not limited, the total haze of the bimorph-type piezoelectric film of the present invention is typically 0.2% or more.

The thickness of the bimorph-type piezoelectric film of the present invention is preferably in the range of 15 to 500 μm, more preferably in the range of 15 to 300 μm, and even more preferably in the range of 15 to 150 μm.

The ratio of piezoelectricity to pyroelectricity of the bimorph-type piezoelectric film of the present invention (in this specification, it may be referred to as an S/N ratio) is preferably $4.0 \times 10^{-3}$ or more, more preferably $5.0 \times 10^{-3}$ or more, more preferably $6.0 \times 10^{-3}$ or more, still even more preferably $7.0 \times 10^{-3}$ or more, particularly preferably $8.0 \times 10^{-3}$ or more, more particularly preferably $10.0 \times 10^{-3}$ or more, and most preferably 50 or more. The upper limit of the S/N ratio is not particularly limited, and the S/N ratio is typically 100 or less.

FIG. 1 shows an embodiment of the bimorph-type piezoelectric film of the present invention. The bimorph-type piezoelectric film 1 comprises
a first pyroelectric film 12,
a tackifier layer or an adhesive agent layer 13, and
a second pyroelectric film 14
in this order,
the first pyroelectric film and the second pyroelectric film being disposed in such a manner that their surfaces on which electric charges of the same polarity (negative charge (−)) are generated by a temperature increase are each outward-facing.

The 31 direction is a horizontal direction in FIG. 1; the 32 direction is a depth direction in FIG. 1; and the 33 direction is a vertical direction in FIG. 1 (the direction parallel to the open arrow in FIG. 1).

When a temperature change occurs in the bimorph-type piezoelectric film 1 of the present invention, the temperature of the first pyroelectric film 12 and the temperature of the second pyroelectric film 14 increase similarly; therefore, a similar electric charge is generated on the outer surfaces of the pyroelectric films. Accordingly, when the difference in electrical potential between the top surface of the first pyroelectric film 12 and the bottom surface of the second pyroelectric film 14 is measured, the electrical signal pyroelectrically generated is reduced, which makes it possible to selectively detect the electrical signal piezoelectrically generated.

Production Method

The bimorph-type piezoelectric film of the present invention can be produced by a commonly used method for producing bimorph-type piezoelectric films.

The bimorph-type piezoelectric film of the present invention can be produced, for example, by adhering a tacky sheet onto the first pyroelectric film, and then adhering the second pyroelectric film onto the tacky sheet, in such a manner that their surfaces on which electric charges of the same polarity are generated by a temperature increase are each outward-facing. When a film having a tackifier applied thereto or a tacky sheet is adhered to another film, the films may be adhered to each other while both are in the form of a sheet, or they may be adhered continuously using a roll-to-roll technique. The pressure applied to adhere the sheet and film is preferably at a level such that the piezoelectric film does not deform. Further, heating may be applied for adhering.

The bimorph-type piezoelectric film of the present invention can also be produced, for example, by applying an adhesive composition to the surface of the first pyroelectric film, and then placing the second pyroelectric film thereon in such a manner that their surfaces on which electric charges of the same polarity are generated by a temperature increase are each outward-facing.

Method for Producing the First and Second Pyroelectric Films

The first and second pyroelectric films can be produced, for example, by forming films by a commonly used film formation method, such as the T-die method or casting method, and then subjecting the film to a polarization treatment.

From the viewpoint of imparting piezoelectric anisotropy, it is preferable that the film be formed by the T-die method and tensile stress be applied in a uniaxial direction to the film formed by the T-die method. The treatment of applying tensile stress to the film in a uniaxial direction includes uniaxial stretching of the film. However, the film is not necessarily stretched.

The film can be stretched by applying to the film a tensile stress higher than the yield point. In contrast, when a tensile stress not higher than the yield point is applied to the film, tensile stress can be applied to the film without stretching the film.

Applying a tensile stress in a uniaxial direction can be performed, for example, by passing the film between multiple pairs of rolls being controlled to have different peripheral speeds.

The stretching magnification in the uniaxial stretching of the film may be, for example, in the range of 2 to 6.

The polarization treatment can be performed by a commonly used method, such as corona discharge treatment.

The polarization treatment is preferably performed by corona discharge.

For corona discharge, negative corona or positive corona may be used. From the viewpoint of ease of polarization of non-polarized resin film, negative corona is preferably used.

The corona discharge treatment is not particularly limited. The treatment can be performed, for example, by applying voltage to a non-polarized film using linear electrodes, as disclosed in JP2011-181748A (Patent Literature 2 described above); or by applying voltage to a non-polarized film using needle-shaped electrodes.

The conditions for the corona discharge treatment may be suitably set based on common knowledge in the art to which the present invention pertains. If the conditions for the corona discharge treatment are overly weak, the obtained pyroelectric film may have insufficient piezoelectricity. On the other hand, if the conditions for the corona discharge treatment are overly strict, the obtained pyroelectric film may have point defects.

For example, when voltage is continuously applied using linear electrodes by a roll-to-roll process, a direct current electric field of, for example, −15 to −25 kV may be used; however, this may vary depending on the distance between the linear electrodes and the non-polarized film, the film thickness, etc. The rate of treatment is, for example, 10 to 500 cm/min.

Alternatively, the polarization treatment may be performed, for example, by applying voltage to a non-polarized film with the film sandwiched between plate electrodes. More specifically, when voltage is applied to a non-polarized film with the film sandwiched between plate electrodes, the following conditions, for example, may be used: a direct current electric field of 0 to 400 MV/m (preferably 50 to 400 MV/m), and a voltage application time of 0.1 seconds to 60 minutes.

Application

Piezoelectric Panel

The bimorph-type piezoelectric film of the present invention can be used for pressure-sensitive sensors etc.

The bimorph-type piezoelectric film of the present invention can be used for piezoelectric panels (e.g., touch panels, preferably touch panels capable of detecting touch pressure) and the like.

The touch panel of the present invention may comprise a pressure-sensitive sensor, and the pressure-sensitive sensor may comprise a bimorph-type piezoelectric film of the present invention.

A touch panel comprising the bimorph-type piezoelectric film of the present invention can detect both the touch position and touch pressure, and has suppressed pyroelectric noise and high transparency.

The bimorph-type piezoelectric film of the present invention can be used for any type of touch panel, such as resistive-type and capacitive-type touch panels.

When the bimorph-type piezoelectric film of the present invention is used in touch panels, it is not necessary to use the film for detecting both the touch position and touch pressure. The bimorph-type piezoelectric film of the present invention may be used for detecting either the touch position or touch pressure.

A piezoelectric panel comprising the bimorph-type piezoelectric film of the present invention may comprise the bimorph-type piezoelectric film of the present invention and electrodes. Preferably, the piezoelectric panel comprises a first electrode (preferably a transparent electrode), the bimorph-type piezoelectric film of the present invention, and a second electrode (preferably a transparent electrode) in this order.

The first electrode is directly or indirectly disposed on a single-side principal surface of the bimorph-type piezoelectric film of the present invention, and the second electrode is directly or indirectly disposed on the opposite-side principal surface of the bimorph-type piezoelectric film of the present invention.

When a piezoelectric panel comprising the bimorph-type piezoelectric film of the present invention (e.g., a touch panel, preferably a touch panel capable of detecting touch pressure) is pressed with a finger or the like, an electrical signal in response to temporal changes in distortion of the bimorph-type piezoelectric film of the present invention can be obtained. Therefore, use of the piezoelectric panel makes it possible to determine the presence or absence of pressing force, speed or intensity (strength) of pressing force, changes in these, or combinations of these. The degree of pressing force (i.e., static pressure) can be determined by using an integral value of the electrical signal.

The first and second pyroelectric films used in the bimorph-type piezoelectric film of the present invention can have pyroelectricity. However, in the bimorph-type piezoelectric film of the present invention, the first and second pyroelectric films are disposed in such a manner that their surfaces on which electric charges of the same polarity (e.g., positive charge and positive charge, or negative charge and negative charge) generated by a temperature increase are each outward-facing. Therefore, in a piezoelectric panel (e.g., a touch panel, preferably a touch panel capable of detecting touch pressure), when a potential difference between the two principal surfaces of the bimorph-type piezoelectric film of the present invention is obtained as electrical signal by the first electrode and the second electrode, the electric signal generated by pyroelectricity is reduced, which makes it possible to selectively obtain the electric signal generated by piezoelectricity.

A touch panel comprising the bimorph-type piezoelectric film of the present invention can be used for input devices and touch sensor devices (or pressure-sensitive sensor devices). In an input device comprising the touch panel (i.e., an input device comprising the bimorph-type piezoelectric film of the present invention), input based on the touch position, touch pressure, or both (e.g., input based on the intensity (strength) of pressing force, such as writing pressure) is possible. An input device and a touch sensor device (or a pressure-sensitive sensor device) each comprising the touch panel can have a position detector and a pressure detector.

The input device can be used for electronic devices (e.g., cellular phones, such as smartphones, personal digital assistants (PDAs), tablet PCs, ATMs, automatic ticket vending machines, digitizers, touchpads, car navigation systems, and touch panel displays (touch panel monitors) of FA (factory automation) devices. An electronic device comprising the input device allows for operations and actions based on the touch position, touch pressure, or both (e.g., operations, such as changing the thickness of lines displayed on a screen according to writing pressure in painting software).

The touch sensor device (or pressure-sensitive sensor device) can be used for electronic devices (e.g., collision sensors and robotic vacuum cleaners).

The electronic devices may comprise the touch input device of the present invention or the touch sensor device of the present invention, or may consist of the touch input device of the present invention or the touch sensor device of the present invention.

Because of its ability to be deformed by electrical signals and vibrate the air, the bimorph-type piezoelectric film of the present invention can be used in a speaker. The speaker can be used in, for example, electronic devices mentioned above as examples in input devices. In particular, because the bimorph-type piezoelectric film of the present invention is transparent, a transparent speaker can be produced by using the film. The transparent speaker can be provided to a display screen of, for example, cellular phones (e.g., smartphones), personal digital assistants (PDAs), and tablet PCs.

EXAMPLES

The following Examples describe the present invention in more detail. However, the present invention is not limited to these Examples.

The measuring method described below was used in the following Examples.

The following devices were used in measurement.

Dynamic viscoelasticity measuring device (DVA-220, product name, produced by IT Measurement Co., Ltd.)

Charge amplifier (Model-4001B-50, product name, produced by Showa Sokki Co. Ltd.)

Heat cycle tester (TSA-73EL thermal shock device, product name, produced by Espec Corp.)

Logger (midi LOGGER GL900 (product name, produced by Graphtec Corp.))

d33 Meter (Piezometer System PM300, product name, produced by Piezotest Ltd., pins with a tip of 1.5 mm φ are used as sample fixtures.)

Measurement of Piezoelectric Signal

The outer periphery of the glass was fixed to a predetermined frame using a double-sided tape, and 100 g of a weight was placed on the intersection of diagonal lines to apply a load. Thereafter, the amount of electric charge generated upon removal of the load was measured using a logger via a charge amplifier. The amount of electric charge generated per unit area was calculated.

Measurement of Pyroelectric Signal

A sample was set in a heat cycle tester. The charge pyroelectrically generated upon change in temperature from $-20°$ C. to $60°$ C. was measured with a logger via a charge amplifier, and the amount of electric charge generated per unit area was calculated.

Measurement of Piezoelectric Constant of Single-Layer Pyroelectric Film

An aluminum electrode was vapor-deposited on each of the upper and lower surfaces of a single-layer pyroelectric film sample with a size of 3 cm×5 mm in such a manner that an area of 2 cm×3 mm of the aluminum electrodes overlapped in a planar view. Two leads made of aluminum foil and reinforced by applying an insulating adhesive tape were adhered individually to the upper and lower flat electrodes using a conductive epoxy resin.

Using a dynamic viscoelasticity measuring device, both ends of the sample were tested at an amplitude of 0.3% and at 1 Hz. The piezoelectric signal that appeared was measured with a logger via a charge amplifier. The electric charge generated per unit area was calculated.

The direction in which the largest amount of electric charge was generated was defined as 31 direction (this direction roughly corresponded to the machine direction (MD)). The direction orthogonal to the 31 direction was defined as 32 direction.

The constant e was determined as the amount of electric charge generated per unit area and unit strain.

The constant d was determined as constant e per storage elastic modulus.

The piezoelectric strain constant $d_{33}$ was measured using a $d_{33}$ meter. The piezoelectric strain constant $d_{33}$ at 10 points on the film selected in a non-arbitrary way was measured. The arithmetic average of the obtained piezoelectric strain constant values $d_{33}$ was defined as the piezoelectric strain constant $d_{33}$ of the film. Specifically, selecting 10 points on the film in a non-arbitrary way was performed by selecting 10 points at intervals of 50 mm therebetween on a straight line.

The actual measurement of the piezoelectric strain constant $d_{33}$ may be a positive value or a negative value, depending on whether the film is measured on the front side or rear side. In the Examples, absolute values are described as the piezoelectric strain constant values $d_{33}$.

Optical Measurement

Total Light Transmittance

The total light transmittance was measured by a light transmission test in accordance with ASTM D1003 using an NDH7000SP CU2II (product name, Nippon Denshoku Industries Co., Ltd.) haze meter.

Haze Value: Outer Haze Value and Inner Haze Value

The total haze value was measured by a light transmission test in accordance with ASTM D1003 using an NDH7000SP CU2II (trade name, Nippon Denshoku Industries Co., Ltd.) haze meter.

The inner haze value was determined by placing water in a glass cell, inserting each film in the cell, and measuring the haze value by the above method for measuring the total haze value.

The total light transmittance and haze value of the produced bimorph-type piezoelectric films were measured using a haze meter NDH 7000SP (product name, Nippon Denshoku Industries Co., Ltd.) before attaching electrodes to the films.

The single-layer films used to produce the bimorph-type piezoelectric films were produced by the following methods.

(1) Production of Extrusion-Molded vinylidene fluoride-tetrafluoroethylene (i.e., vinylidene fluoride-tetrafluoroethylene) Copolymer Film (Film 1)

Using an extruder, a material of a vinylidene fluoride-tetrafluoroethylene copolymer (vinylidene fluoride:tetrafluoroethylene=40:60 mol %; the amount of the other constituent units was 1 mol % or less) was supplied to a T-die while heating, and the melted vinylidene fluoride-tetrafluoroethylene copolymer was supplied between pairs of metal rolls from the T-die and extruded into a film, while cooling, thus forming a film.

As conditions under which the film is not stretched, the peripheral speeds of rotation of adjacent pairs of rolls were set to differ 1.2-fold, whereby a tensile stress not exceeding the yield point was applied to the film to form a film of a vinylidene fluoride-tetrafluoroethylene copolymer with a film thickness of 20 μm (film 1).

(2) Production of Stretched PVDF Film (Film 2)

Vinylidene fluoride was extruded into a film in the same manner as above in (1), except that a vinylidene fluoride material was used in place of the vinylidene fluoride-tetrafluoroethylene copolymer.

As conditions under which the film is stretched, the peripheral speeds of rotation of adjacent pairs of rolls were set to differ 4-fold, whereby a tensile stress exceeding the yield point was applied to the film to form a vertically uniaxially stretched film of vinylidene fluoride with a film thickness of 58 μm (film 2). The stretching magnification was 4 times.

(3) Production of Cast vinylidene fluoride-tetrafluoroethylene Copolymer Film (Film 3)

A solution of a vinylidene fluoride-fluorinated tetrafluoroethylene copolymer (vinylidene fluoride: tetrafluoroethylene copolymer=80:20 mol %) material in methyl ethyl ketone was cast on a PET substrate, and the solvent was evaporated at 150° C. to form a film of the vinylidene fluoride-tetrafluoroethylene copolymer with a film thickness of 20 μm (film 3).

(4) Polarization Operation

Each film thus formed was sandwiched with metal electrodes vertically, and a direct electric field of 1,200 kV/cm was applied at room temperature for 5 minutes for polarization.

(5) Production of Bimorph-Type Piezoelectric Film

The single-layer film produced above was cut to a size of 12 cm×15 cm in such a manner that the 31 direction was the longer side.

Two sheets of the single-layer film were bonded together via an MHM-GAW10 (produced by Nichiei Kakoh Co., Ltd.) tackifier in such a manner that their polarized directions were opposite to each other, thus forming a bimorph film. In this production, the two sheets of the film were bonded in such a manner that their 31 directions were parallel or orthogonal to each other.

In this production, the thickness of the tackifier layer was 10 μm.

The bimorph film was cut to a size of 5 cm×10 cm. An aluminum electrode (flat electrode) was patterned on both surfaces of the bimorph film by vapor-deposition with heating.

Electrodes of two leads (3 mm×8 cm) made of aluminum foil and reinforced by applying an insulating adhesive tape were adhered individually to the upper and lower flat electrodes using a conductive epoxy resin.

This was bonded to a tempered glass with a size of 126 mm×61 mm×0.5 mm via a tackifier (MHM-GAW10, product name, produced by Nichiei Kakoh Co., Ltd.).

As a sample of a bimorph-type film comprising film 1, a sample in which the portions of the upper and lower electrodes overlapping in a planar view had different aspect ratios was prepared in a similar manner. The aspect ratios in the frame described above were adjusted to coincide with these aspect ratios.

Using these bimorph-type film samples, various tests were performed.

Each test was carried out by the method described above.

Tables 1 and 2 show the test results (the average when n=3).

Table 1 shows the measured values of d31, d32, e31, and e32 of each single-layer film; and calculated values of "d31−32," "d31/d32," "e31−e32," and "e31/e32" of each single-layer film.

Table 2 shows the total light transmittance and total light transmittance of each bimorph-type film; and the measured d33 value, the amount of electric charge generated piezoelectrically, the amount of electric charge generated pyroelectrically, and S/N ratio of each bimorph-type film.

TABLE 1

| Film | $d_{31}$ (pC/N) | $d_{32}$ (pC/N) | $e_{31}$ (mC/m$^2$) | $e_{32}$ (mC/m$^2$) | $d_{31}-d_{32}$ (pC/N) | $d_{31}/d_{32}$ (no unit) | $e_{31}-e_{32}$ (mC/m$^2$) | $e_{31}/e_{32}$ (no unit) |
|---|---|---|---|---|---|---|---|---|
| 1 | 5.38 | 1.38 | 4.06 | 1.01 | 4.0 | 3.9 | 3.05 | 4.0 |
| 2 | 26.4 | 1.94 | 56.0 | 3.92 | 24.5 | 13.6 | 52.0 | 14.3 |
| 3 | 6.25 | 5.88 | 6.13 | 5.31 | 0.37 | 1.06 | 0.81 | 1.15 |

TABLE 2

| | Film | Thickness of the film Mm | Bonding direction | Aspect ratio | Total light beam transmittance % | Total haze % | Amount of electric charge generated piezoelectrically μC/m$^2$ | Amount of electric charge generated pyroelectrically μC/m$^2$ | S/N (piezoelectricity/ pyroelectricity) ×10$^{-3}$ |
|---|---|---|---|---|---|---|---|---|---|
| Example 1a | 1 | 20 | Forward direction | 1:2.26 | 94.24 | 7.05 | 0.0049 | 1.89 | 2.56 |
| Example 1b | 2 | 20 | Orthogonal | 1:2.26 | 94.24 | 7.05 | 0.0162 | 2.69 | 6.02 |
| Example 2a | 2 | 58 | Forward direction | 1:2.26 | 90.63 | 7.62 | 0.1084 | 42.31 | 2.56 |
| Example 2b | 2 | 58 | Orthogonal | 1:2.26 | 90.63 | 7.62 | 0.4343 | 45.13 | 9.62 |
| Comparative Example 1 | 3 | 20 | The machine direction is orthogonal | 1:2.26 | 93.73 | 1.84 | 0.0129 | 11.93 | 1.08 |
| Example 3b | 1 | 20 | Orthogonal | 1:3 | 94.24 | 7.05 | 0.0456 | 4.19 | 10.89 |

As can be understood from these results, the bimorph film formed by bonding two pyroelectric films in such a manner that their 31 directions were orthogonal had a higher S/N ratio than the bimorph film formed by bonding two pyroelectric films in such a manner that their 31 directions were parallel.

The higher the aspect ratio, the higher the S/N ratio.

INDUSTRIAL APPLICABILITY

The bimorph-type piezoelectric film of the present invention can be used, for example, for pressure-sensitive sensors and piezoelectric panels, such as touch panels capable of detecting touch pressure.

The invention claimed is:

1. A bimorph-type piezoelectric film comprising
a first pyroelectric film having piezoelectric anisotropy in an in-plane direction, and
a second pyroelectric film having piezoelectric anisotropy in an in-plane direction, the first pyroelectric film and the second pyroelectric film being disposed in such a manner that their surfaces on which electric charges of the same polarity are generated by a temperature increase are each outward-facing.

2. The bimorph-type piezoelectric film according to claim 1, wherein the 31 direction of the first pyroelectric film and the 31 direction of the second pyroelectric film have a deviation in a rotational direction, the 31 direction being defined as a direction in which drawing the pyroelectric film generates the maximum charge per unit area when the film is drawn in various directions with a constant force not higher than the yield stress, or in such a manner that the strain generated by a force not higher than the yield stress is constant.

3. The bimorph-type piezoelectric film according to claim 1, wherein the aspect ratio of the first pyroelectric film and the aspect ratio of the second pyroelectric film are almost the same, and each exceeds 1.

4. The bimorph-type piezoelectric film according to claim 1, wherein the first pyroelectric film and the second pyroelectric film are each a pyroelectric film of a vinylidene fluoride-based polymer.

5. The bimorph-type piezoelectric film according to claim 1, wherein the first pyroelectric film and the second pyroelectric film are each a pyroelectric film of polyvinylidene fluoride.

6. The bimorph-type piezoelectric film according to claim 1, wherein the first pyroelectric film and the second pyroelectric film are each a pyroelectric film of a vinylidene fluoride-tetrafluoroethylene copolymer.

7. The bimorph-type piezoelectric film according to claim 1, wherein the first pyroelectric film and the second pyroelectric film are each a pyroelectric film of a vinylidene fluoride-trifluoroethylene copolymer.

8. The bimorph-type piezoelectric film according to claim 1, which has a total light transmittance of 80% or more and a total haze value of less than 15.0%.

9. A pressure-sensitive sensor comprising the bimorph-type piezoelectric film according to claim 1.

10. A touch panel comprising the pressure-sensitive sensor according to claim 9.

* * * * *